(12) United States Patent
Bjornsen (10) Patent No.: US 7,129,874 B2
(45) Date of Patent: Oct. 31, 2006

(54) METHOD AND APPARATUS FOR OPERATING A PIPELINED ADC CIRCUIT

(75) Inventor: Johnny Bjornsen, Trondheim (NO)

(73) Assignee: Nordic Semiconductor ASA, Tiller (NO)

( * ) Notice: Subject to any disclaimer, the term of this patent is extended or adjusted under 35 U.S.C. 154(b) by 0 days.

(21) Appl. No.: 11/149,899

(22) Filed: Jun. 10, 2005

(65) Prior Publication Data
US 2005/0275577 A1    Dec. 15, 2005

Related U.S. Application Data

(60) Provisional application No. 60/579,016, filed on Jun. 10, 2004.

(51) Int. Cl.
  *H03M 3/00* (2006.01)
(52) U.S. Cl. ............. 341/143; 341/120; 341/119; 341/118
(58) Field of Classification Search .......... 341/155, 341/143, 131
  See application file for complete search history.

(56) References Cited

U.S. PATENT DOCUMENTS

| | | | | |
|---|---|---|---|---|
| 5,153,593 | A | * | 10/1992 | Walden et al. ............ 341/143 |
| 5,500,645 | A | * | 3/1996 | Ribner et al. ............. 341/143 |
| 5,889,482 | A | * | 3/1999 | Zarubinsky et al. ........ 341/131 |
| 5,949,361 | A | * | 9/1999 | Fischer et al. ............ 341/143 |
| 5,982,313 | A | * | 11/1999 | Brooks et al. ............. 341/143 |
| 6,556,158 | B1 | * | 4/2003 | Steensgaard-Madsen .... 341/131 |

OTHER PUBLICATIONS

Siragusa et al., "A Digitally Enhanced 1.8-V 15-bit 40-MSample/s CMOS Pipelined ADC," IEEE Journal of Solid-State Circuits, vol. 39, No. 12, Dec. 2004.
Siragusa et al., "Gain Error Correction Technique for Pipelined Analogue-to-Digital Converters," Electronics Letters, vol. 36, No. 7, Mar. 30, 2000.
Qin et al., "Sigma-Delta ADC with Reduced Sample Rate Multibit Quantizer," IEEE Transactions on Circuits and Systems-II Analog and Digital Signal Processing, vol. 46, No. 6, Jun. 1999, 824-828.

* cited by examiner

*Primary Examiner*—Jean Bruner Jeanglaude
(74) *Attorney, Agent, or Firm*—Marshall, Gerstein & Borun LLP (57) ABSTRACT

An analog-to-digital converter (ADC) circuit that converts an analog input signal into a digital output circuit includes a noise shaping first stage cascaded with a pipelined second stage. The first stage includes a sample-and-hold circuit and a first order modulator, where the first order modulator includes a noise shaping filter, a FLASH ADC and a feedback DAC. A digital dither generator is used to provide a dither signal to the ADC circuit. The second stage includes a switching circuit and an ADC. A calibration filter connected to the second stage calibrates the ADC circuit. A first reconstruction filter and a second reconstruction filter are used to recombine outputs of the first stage and the second stage of the ADC circuit. The ADC circuit allows high resolution analog-to-digital conversion at a low over-sampling rate and low power dissipation levels.

18 Claims, 13 Drawing Sheets

METHOD AND APPARATUS FOR OPERATING A PIPELINED ADC CIRCUIT

CROSS-REFERENCES TO RELATED APPLICATIONS

This application claims priority to U.S. Provisional Application Ser. No. 60/579,016, entitled, "Method and Apparatus for Operating a Pipelined ADC Circuit," filed Jun. 10, 2004, the disclosure of which is hereby expressly incorporated herein by reference.

TECHNICAL FIELD

This patent relates generally to analog-to-digital converters, and more specifically to an apparatus and a method for operating a pipelined analog-to-digital converter.

BACKGROUND

Analog-to-digital converters (ADCs) are employed in a variety of electronic systems including computer modems, wireless telephones, satellite receivers, process control systems, etc. Such systems demand cost-effective ADCs that can efficiently convert an analog input signal to a digital output signal over a wide range of frequencies and signal magnitudes with minimal noise and distortion.

An ADC typically converts an analog signal to a digital signal by sampling the analog signal at pre-determined sampling intervals and generating a sequence of binary numbers via a quantizer, wherein the sequence of binary numbers is a digital representation of the sampled analog signal. Some of the commonly used types of ADCs include integrating ADCs, Flash ADCs, pipelined ADCs, successive approximation register ADCs, Delta-Sigma ($\Delta\Sigma$) ADCs, two-step ADCs, etc. Of these various types, the pipelined ADCs and the $\Delta\Sigma$ ADCs are particularly popular in applications requiring higher resolutions.

A pipelined ADC circuit samples an analog input signal using a sample-and-hold circuit to hold the input signal steady and a first stage flash ADC to quantize the input signal. The first stage flash ADC then feeds the quantized signal to a digital-to-analog converter (DAC). The pipelined ADC circuit subtracts the output of the DAC from the analog input signal to get a residue signal of the first stage. The first stage of the pipelined ADC circuit generates the most significant bit (MSB) of the digital output signal. The residue signal of the first stage is gained up by a factor and fed to the next stage. Subsequently, the next stage of the pipelined ADC circuit further quantizes the residue signal to generate further bits of the digital output signal.

On the other hand, a $\Delta\Sigma$ ADC employs over-sampling, noise-shaping, digital filtering and digital decimation techniques to provide high resolution analog-to-digital conversion. One popular design of a $\Delta\Sigma$ ADC is multi-stage noise shaping (MASH) $\Delta\Sigma$ ADC. A MASH $\Delta\Sigma$ ADC is based on cascading multiple first-order or second-order $\Delta\Sigma$ ADCs to realize high-order noise shaping. An implementation of a MASH $\Delta\Sigma$ ADC is well known to those of ordinary skill in the art. While both pipelined ADCs and $\Delta\Sigma$ ADCs provide improved signal-to-noise ratio, improved stability, etc., $\Delta\Sigma$ ADCs generally provide higher levels of resolution and therefore are preferred in applications involving asynchronous digital subscriber lines (ADSL), very high speed digital subscriber lines (VDSL), etc. Highly-linear, high-resolution and wide-bandwidth ADCs are required for VDSL systems.

However, $\Delta\Sigma$ ADCs typically employ higher over-sampling ratios (OSRs) to achieve such higher resolutions, normally of the range of OSRs over 50. Such high OSR results in higher level of power dissipation. Moreover, $\Delta\Sigma$ ADCs also require anti-alias filters for inputting analog signals into a first stage of the $\Delta\Sigma$ ADC. Such anti-aliasing filters also result in higher power dissipation. Therefore there is a need for an ADC circuit that can provide high resolution digital output at a lower OSRs and/or lower levels of power dissipation.

BRIEF DESCRIPTION OF THE DRAWINGS

The present patent is illustrated by way of examples and not limitations in the accompanying figures, in which like references indicate similar elements, and in which.

DETAILED DESCRIPTION OF THE EXAMPLES

An analog-to-digital converter (ADC) system that converts an analog input signal into a digital output signal includes a noise shaping first stage cascaded with a pipelined second stage. The first stage includes a sample-and-hold circuit and a first order modulator, where the first order modulator includes a noise shaping filter, a FLASH ADC and a feedback DAC. A digital dither generator is used to provide a dither signal to the ADC circuit. The second stage includes a switching circuit and an ADC. A calibration filter connected to the second stage calibrates the ADC circuit. A first reconstruction filter and a second reconstruction filter are used to recombine outputs of the first stage and the second stage of the ADC circuit. The ADC circuit allows high resolution analog-to-digital conversion at a low over-sampling rate and low power dissipation levels.

An embodiment of the analog-to-digital converter system for converting an analog input signal to a digital output signal comprises a first stage analog-to-digital converter circuit adapted to convert the analog input signal into a first stage digital output; a combiner coupled to the first stage analog-to-digital converter circuit and adapted to combine a digital test signal with the first stage digital output; a residue signal generator adapted to receive the output of the combiner and to generate a residue signal using the output of the combiner and the analog input signal; a noise shaping circuit adapted to noise shape the residue signal; a sampling circuit coupled to the output of the noise shaping circuit and adapted to sample the noise shaped residue signal; a second stage analog-to-digital converter circuit coupled to the output of the sampling circuit and adapted to generate a second stage digital output based on the sampled residue signal; and a digital correction circuit coupled to the output of the first stage analog-to-digital converter circuit and to the output of the second stage analog-to-digital converter circuit and adapted to combine the first stage digital output and the second stage digital output using a reconstruction filter.

In an embodiment of such an analog-to-digital converter system the first stage analog-to-digital converter circuit operates at a first operating frequency and the second stage analog-to-digital converter circuit operates at a second operating frequency, wherein the second operating frequency is a fraction of the first operating frequency. In yet another embodiment of such an analog-to-digital converter system the second operating frequency is equal to a Nyquist frequency of the sampling circuit and the first operating frequency is at least twice the Nyquist frequency of the sampling circuit.

An embodiment of the analog-to-digital converter system further comprises a digital signal generator adapted to generate the digital test signal, wherein the digital signal generator is further adapted to change an amplitude of the digital test signal based on one of a polarity or an amplitude of the analog input signal. In yet another embodiment of the analog-to-digital converter system the digital signal generator is further adapted to change an amplitude of the digital test signal in a manner so as to prevent the second stage analog-to-digital converter circuit from saturating. In yet another embodiment of the analog-to-digital converter system the digital correction circuit further includes a decimation filter adapted to cancel the effect of the digital test signal from the combination of the first stage digital output and the second stage digital output.

In yet another embodiment of the analog-to-digital converter system the second stage analog-to-digital converter circuit is one of a pipelined analog-to-digital converter circuit or a cyclic analog-to-digital converter circuit and wherein the first stage analog-to-digital converter circuit is a delta sigma analog-to-digital converter circuit. In yet another embodiment of the analog-to-digital converter system, the first stage analog-to-digital converter circuit further includes a multiplier coupled to the output of the noise shaping circuit and adapted to multiply the output of the noise shaping circuit, a feed-forward path adapted to feed-forward the analog input signal to a summer circuit, the summer circuit adapted to combine the analog input signal and the output of the multiplier, and a quantizer adapted to generate a quantized output signal based on the combined output of the summer circuit. In an alternate embodiment of such an analog-to-digital converter system the quantizer is further adapted to introduce an offset into the quantized output signal.

An alternate embodiment of such an analog-to-digital converter system further comprises an offset correction circuit adapted to correct the offset introduced by the quantizer, wherein the second stage analog-to-digital converter circuit includes a calibration filter adapted to correct gain errors and pole errors in the first stage digital output.

An alternate embodiment of the analog-to-digital converter system includes a method of converting an analog input signal to a digital output signal, the method comprising generating a first stage digital output based on the analog input signal; combining the first stage digital output with a digital test signal; generating a residue signal from the combination of the first stage digital output and the digital test signal; noise-shaping the residue signal; sampling the noise shaped residue signal at a second operating frequency; generating a second stage digital output signal based on the sampled residue; and combining the first stage digital output and the second stage digital output in a manner so as to cancel the effect of the digital test signal.

In an alternate embodiment of such an analog-to-digital converter system generating the first stage digital output includes generating the first stage digital output using a first stage analog-to-digital converter circuit operating at a first frequency, and the second operating frequency is a fraction of the first operating frequency. In an alternate embodiment of such an analog-to-digital converter system the second operating frequency is equal to a Nyquist frequency of a sampling circuit used for sampling the noise shaped residue signal and the first operating frequency is at least twice the Nyquist frequency of a sampling circuit. In an alternate embodiment of such an analog-to-digital converter system noise-shaping the residue of the first stage analog-to-digital converter circuit further includes providing a gain to the residue of the first stage analog-to-digital converter circuit.

Yet another embodiment of the analog-to-digital converter system further comprises changing the amplitude of the digital test signal based on one of a polarity or an amplitude of the analog input signal. An alternate embodiment of such an analog-to-digital converter system further comprises changing the amplitude of the digital test signal in a manner so as to prevent the second stage analog-to-digital converter circuit from saturating.

Figure 1:
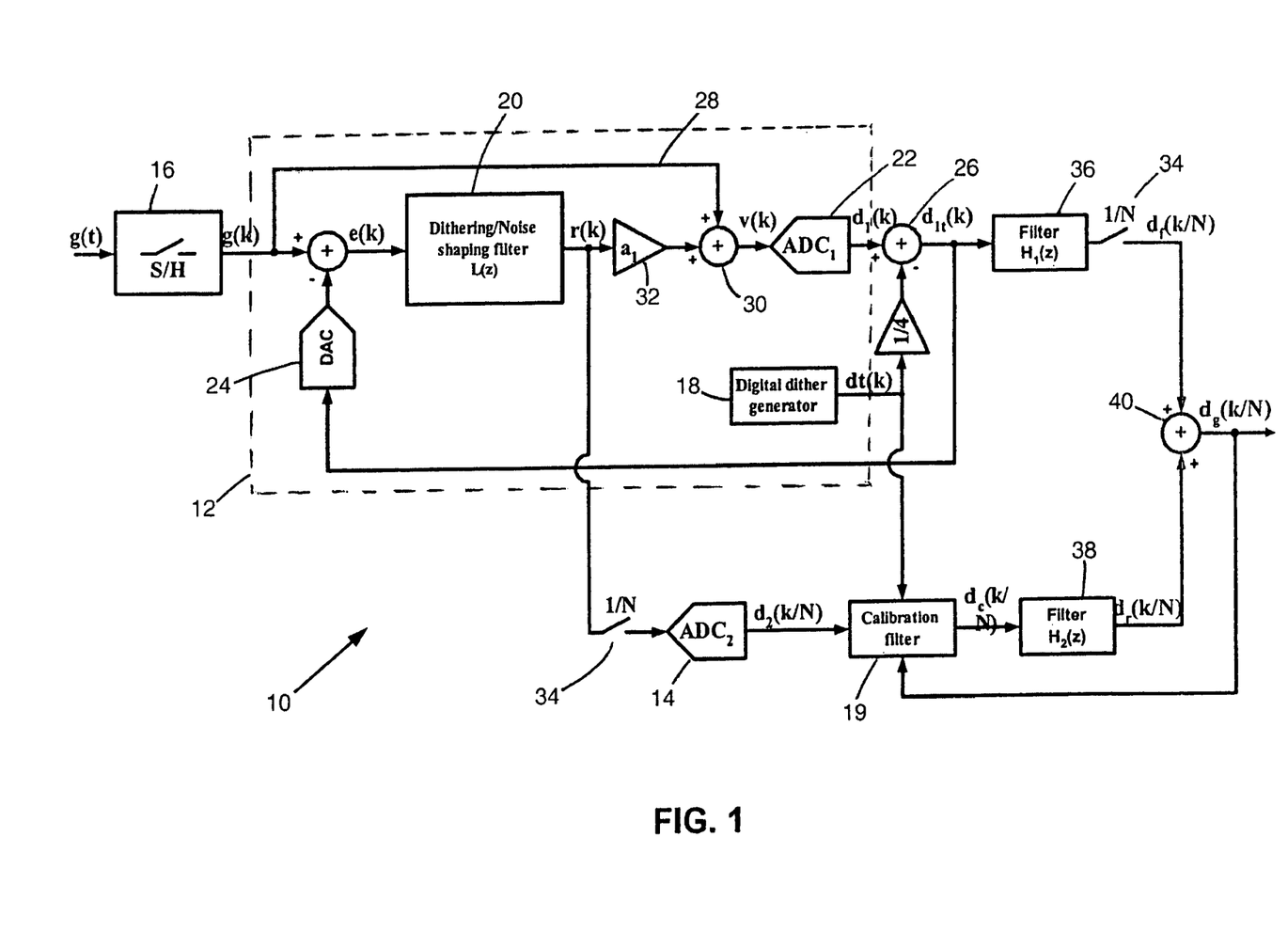
FIG. 1 is a block diagram of an ADC circuit operating at lower sampling rates.

Referring now to the accompanying drawings, FIG. 1 illustrates an ADC circuit 10 that converts an analog input signal g(t) into a digital output signal dg(k/N). The ADC circuit 10 includes a noise shaping first stage 12 cascaded with a pipelined second stage 14. The ADC circuit 10 also includes a sample-and-hold circuit 16 to input the analog input signal g(t), a digital dither generator 18 to generate a dither signal dt(k), and a calibration filter 19. The second stage 14 is represented by an ADC labeled ADC2 14. The ADC2 14 may have a resolution close to the overall resolution of the ADC circuit 10. In this example, the ADC2 is a 12 bit ADC with a signal-to-noise ratio (SNR) of 74 dB.

The first stage 12 includes a noise shaping filter 20, a FLASH ADC labeled ADC1 22 and a feedback DAC 24. The noise shaping filter 20 provides a gain, noise shaping and dithering. The ADC1 22 converts an analog input signal v(k) into a digital signal d1(k). A summation circuit 26 combines the digital signal d1(k) with the dither signal d(t) to generate a combined signal d11(k). The signal d1t(k) is input into the feedback DAC 24, which converts it into an analog signal. The output of the feedback DAC 24 is subtracted from the analog input signal g(k) to generate a residue signal e(k). The noise shaping filter 20 provides gain, noise shaping and dithering to the residue signal e(k).

The noise shaping filter 20 is used to increase a sampling frequency of the ADC circuit 10 while keeping the sampling frequency of ADC2 14 fixed at the Nyquist frequency. For example, in a very high speed digital subscriber lines (VDSL) system having a 12 MHz bandwidth, using the ADC circuit 10, the S/H circuit 16 can operate at 100 MHz and the ADC2 14 can operate at 25 MHz. This feature reduces the overall power dissipation of the ADC circuit 10 significantly compared to a case when the ADC2 14 is operating at 100 MHz. Normally when the ADC2 14 is operating at 100 MHz, a decimation is applied to the output of the ADC circuit 10, resulting in increased power dissipation. The reason for the significant reduction in power dissipation is the design of the first stage 12, which may include only one integrator in the noise shaping filter 20, one simple 3.1 bit FLASH ADC as ADC 1 22, and only one feedback DAC 24. The total power dissipation of running these components of the first stage 12 at 100 MHz and the second stage 14 at 25 MHz is significantly less than running the second stage 14 at 100 MHz, as it would be necessary without the noise-shaping filter 20 of the first stage 12.

The noise-shaping filter 20 also provides an analog gain, thereby improving the signal-to-noise ratio (SNR) of the ADC2 14 with an amount equal to the analog gain. However, the improvement of SNR of the ADC2 14 depends on an over-sampling ratio (OSR). At OSRs of two and four the improvement in an overall SNR of the ADC circuit 10 is less than the analog gain provided by the noise-shaping filter 20. Moreover, the noise-shaping filter 20 provides analog noise shaping, thus increasing the SNR of the ADC circuit 10 at high OSRs. The noise shaping becomes effective for OSRs above four. For instance, at an OSR of eight, the achievable SNR is 96 dB compared to and SNR of 87 dB at an OSR of four. Finally, the noise-shaping filter 20 dithers the input to the ADC2 14, thus improving the overall linearity of the ADC circuit 10.

The first stage 12 of the ADC circuit 10 operates like a $\Delta\Sigma$ ADC circuit due to the noise shaping provided by the noise shaping filter 20. However, due to the analog gain provided by the noise shaping filter 20, the first stage 12 also behaves like a stage of a pipelined ADC circuit. This is possible due to a forward path 28 from the sampled input signal g(k) to a summation circuit 30 before ADC1 22, and due to scaling of the output r(k) of the noise shaping filter 20 with an analog gain component 32 providing a gain of a1. Alternate implementations of the first stage 12 using multiple outputs from the noise shaping filter 20 are possible. For example, the noise shaping filter 20 can have n outputs, each of them can be scaled with factors a1 . . . an, and a sum of the scaled outputs may be added to the input signal g(k) to get a combined signal v(k), which is fed to ADC1 22.

The output of the noise shaping filter 20 r(k) is fed to the ADC2 14 for further quantization. The output of the ADC2 14 may be gain calibrated by the calibration filter 19. However, the calibration filter 19 is optional. The purpose of the calibration filter 19 is to digitally compensate for any errors introduced in the first stage 12. The gain calibration filter 19 performs such calibration by measuring the output dg(k/N) and correlating it against the dither signal dt(k). The ADC circuit 10 uses a switching device 34 that reduces the sampling by the ADC2 14 by a ratio of 1/N. Recombination filters 36 and 38 filters the outputs of the first stage 12 and the ADC2 14. A recombination circuit 40 combines the outputs of the reconstruction filters 36 and 38 to generate the digital output signal dg(k/N).

Figure 2:
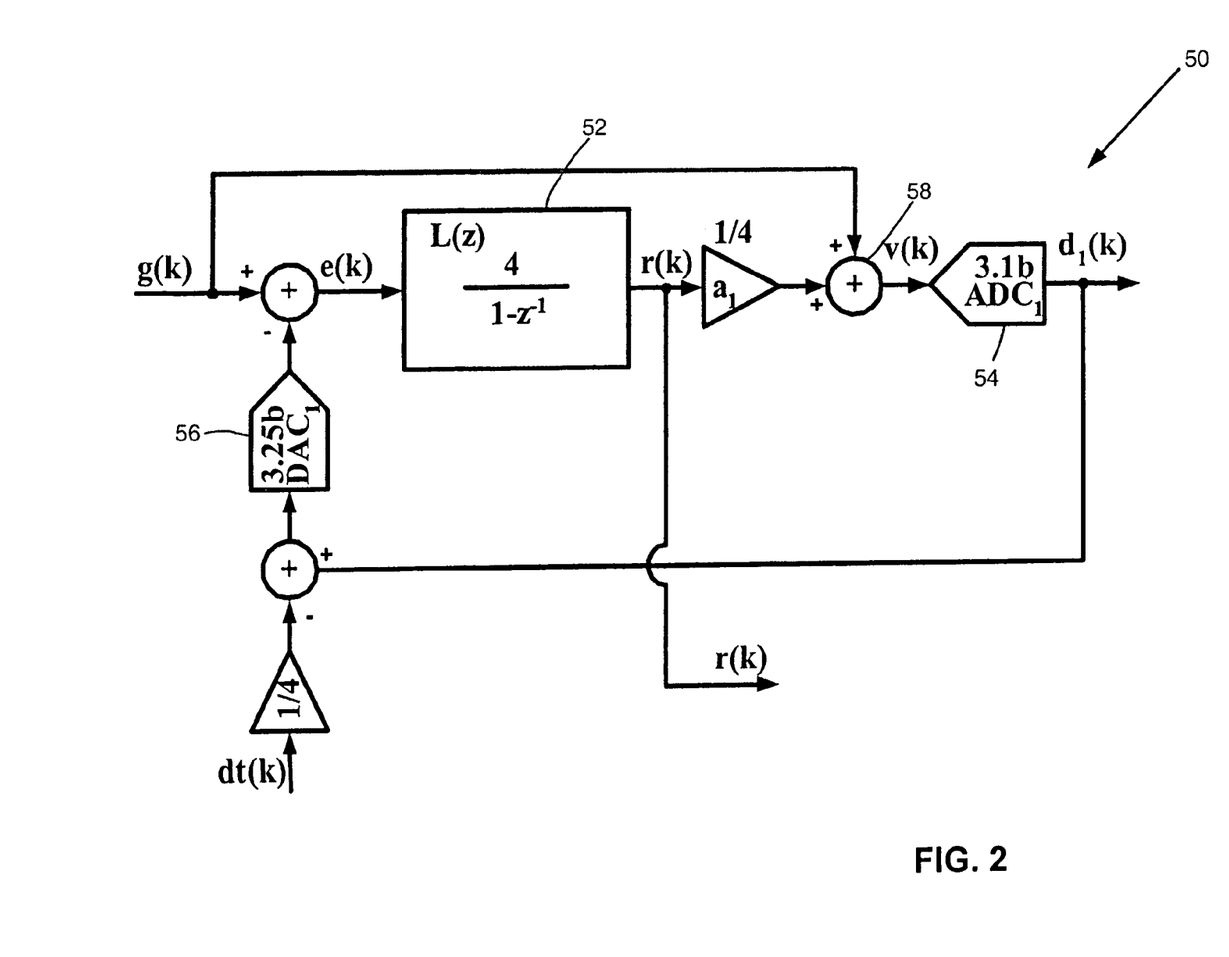
FIG. 2 is a block diagram of a first order modulator used in the ADC circuit of FIG. 1.

FIG. 2 is a block diagram of a first order modulator 50 used in the ADC circuit of FIG. 1. The first order modulator 50 includes an integrator 52 with a built-in gain of 4. An ADC1 54 can be a single-bit or a multi-bit quantizer. In this example, the ADC1 54 is shown by a 3.1-bit FLASH ADC. The ADC1 54 is configured with ¼ LSB systematic offset in its comparator, as it would be in a pipeline stage, with the benefit of improved linearity of a $\Delta\Sigma$ modulator. A feedback DAC 56 converts the output of the ADC1 54 into an analog signal. Here the feedback DAC 56 is implemented as a 3.25 bit DAC, where the term 3.25 bit is referred to denote that the DAC 56 has ten reference levels.

Figure 3:
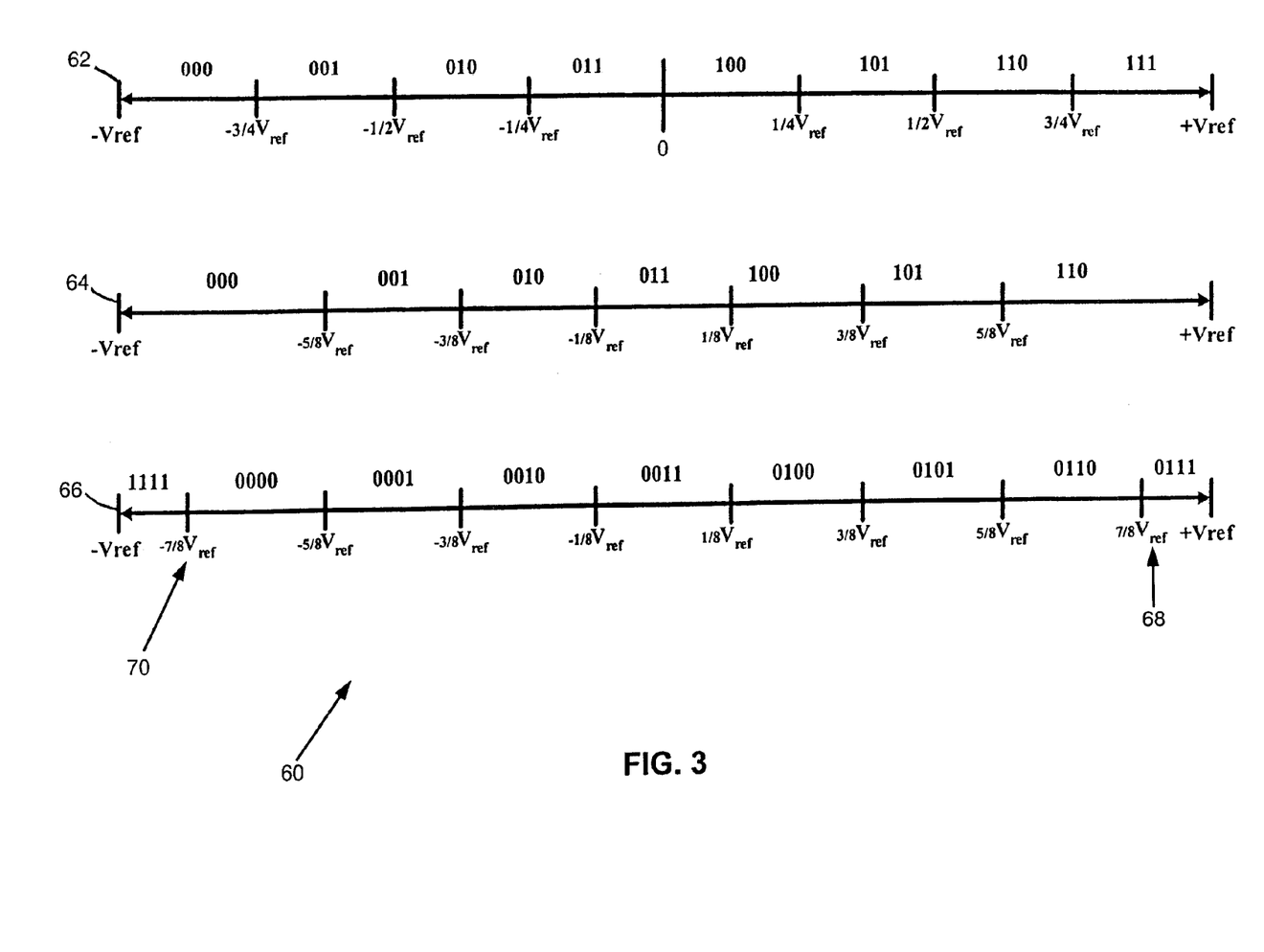
FIG. 3 is an exemplary signal diagram of reference voltages of various flash ADCs used in the first order modulator of FIG. 2.

FIG. 3 is an exemplary signal diagram 60 of reference voltages for the ADC1 54 of FIG. 2 implemented as a 3.1-bit FLASH ADC. (Here the term 3.1 bit ADC is used to denote an ADC having nine output levels. Generally, an x.y bit ADC is said to have $2^x+y$ output levels. However, please note that a 1.5 bit ADC has three output levels and a 2.5 bit ADC has six output levels). In FIG. 3, the signal diagram 62 shows reference voltages for a regular 3 bit FLASH ADC, while the signal diagram 64 shows a configuration of a 2.5 bit FLASH ADC (six reference voltage levels) when used in a pipeline ADC stage with an analog gain of four. The signal diagram 66 shows the reference voltages for the ADC1 54 of FIG. 2 implemented as a 3.1 bit FLASH ADC. Compared to the signal diagram 64 the signal diagram 66 has two extra comparators, one 68 at the top and another 70 at the bottom of the input range. This feature allows for full input swing to the modulator 50, which is a major benefit compared to a regular modulators that usually saturate at an input voltage level 6 dB below full scale reference voltages.

The 3.1 bit configuration of the ADC1 54 uses two extra comparators than a comparable pipeline stage to accommodate the memorized output from the integrator 52. This configuration of the ADC1 54 allows for digital correction of offsets in ADC1 54 by means of redundancy. Such offset correction suppresses first order nonlinearity in the ADC circuit 10 compared to a regular □□ modulator without correction of offsets. With the systematic offset in the ADC1 54 and the subsequent digital correction, only second order effects of the offset contribute to nonlinearity through the noise shaping filter 20, thus enhancing the overall linearity of the ADC circuit 10.

Figure 4:
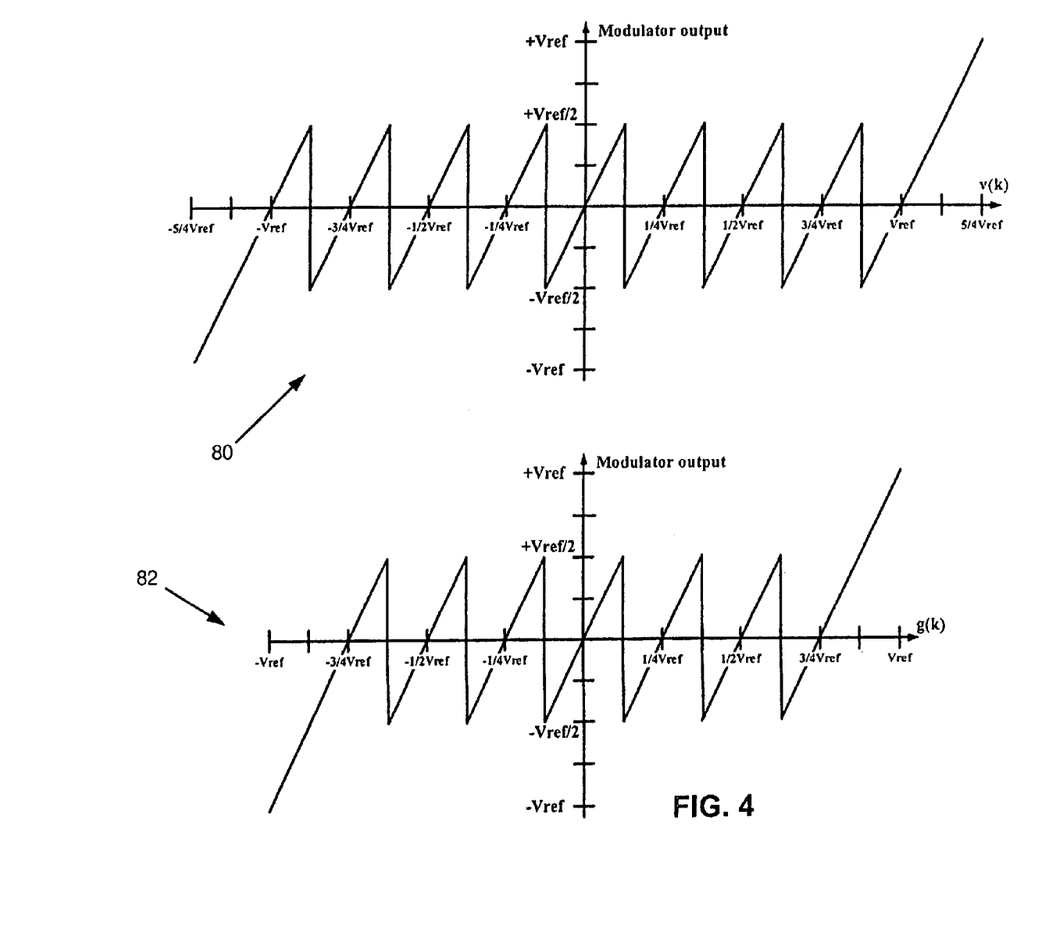
FIG. 4 describes exemplary transfer functions of the first order modulator of FIG. 2.

FIG. 4 describes exemplary transfer functions of the first order modulator 50 of FIG. 2. Specifically, FIG. 4a describes a transfer function 80 of the modulator 50 in response to an output v(k) of a summing node 58 before the ADC1 54. As shown, amplitudes up to +/−1.25 Vref are allowed at this node. This is to fit in a full scale +/−1 V input while featuring a worst case memory of +/−1 V at the integrator output. After scaling and summing, the worst case sum becomes +/−1.25 $V_{ref}$. FIG. 4b describes one possible transfer function of the first order modulator 50 as a function of the amplitude of the input signal g(k). Because the integrator 52 dithers the transfer function 82 to a seemingly nonlinear function, the shape of the transfer function 82 will depend on the level and shape of the input signal g(k).

Figure 5:
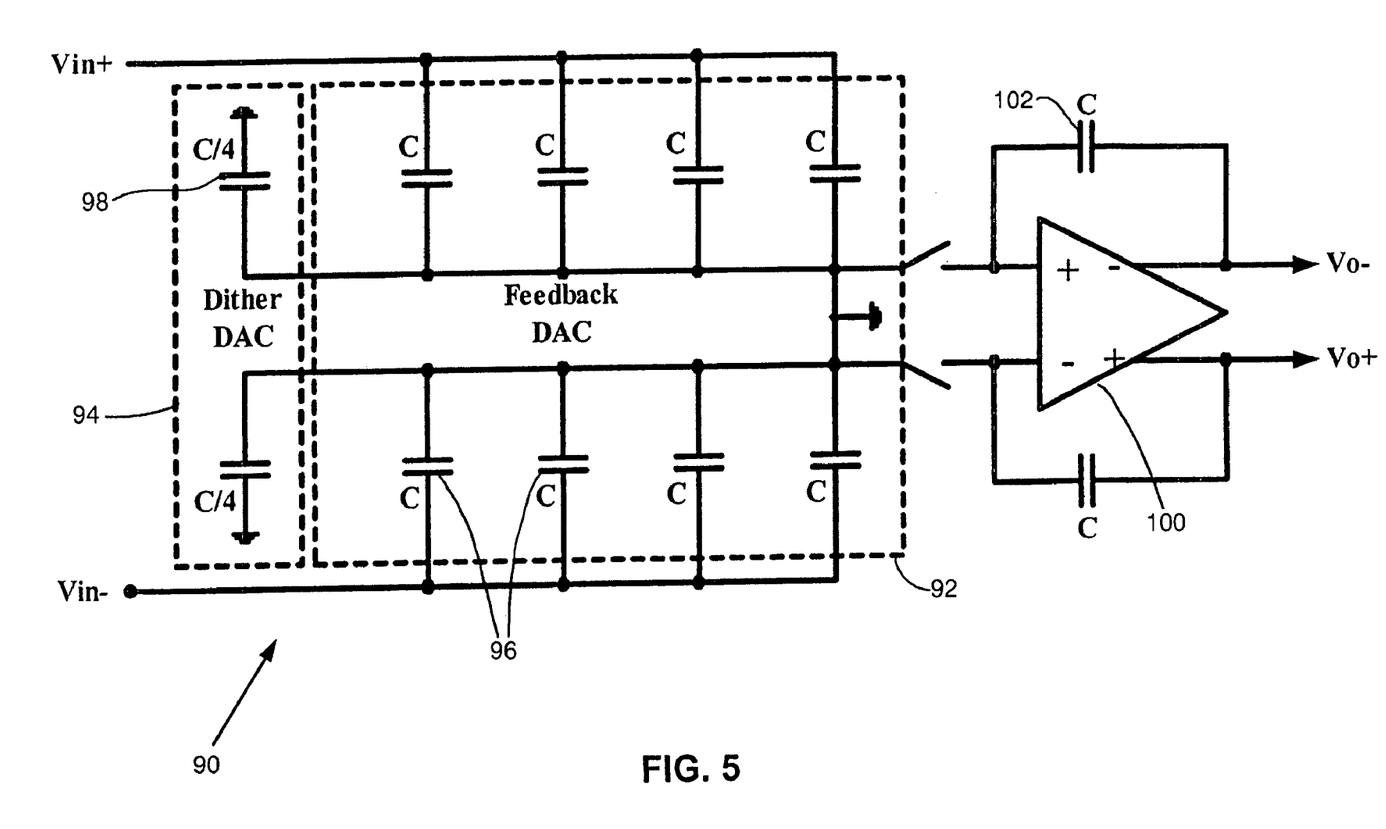
FIG. 5 is an exemplary circuit diagram of a multiplying and integrating DAC used in the first order modulator of FIG. 2.
Figure 6:
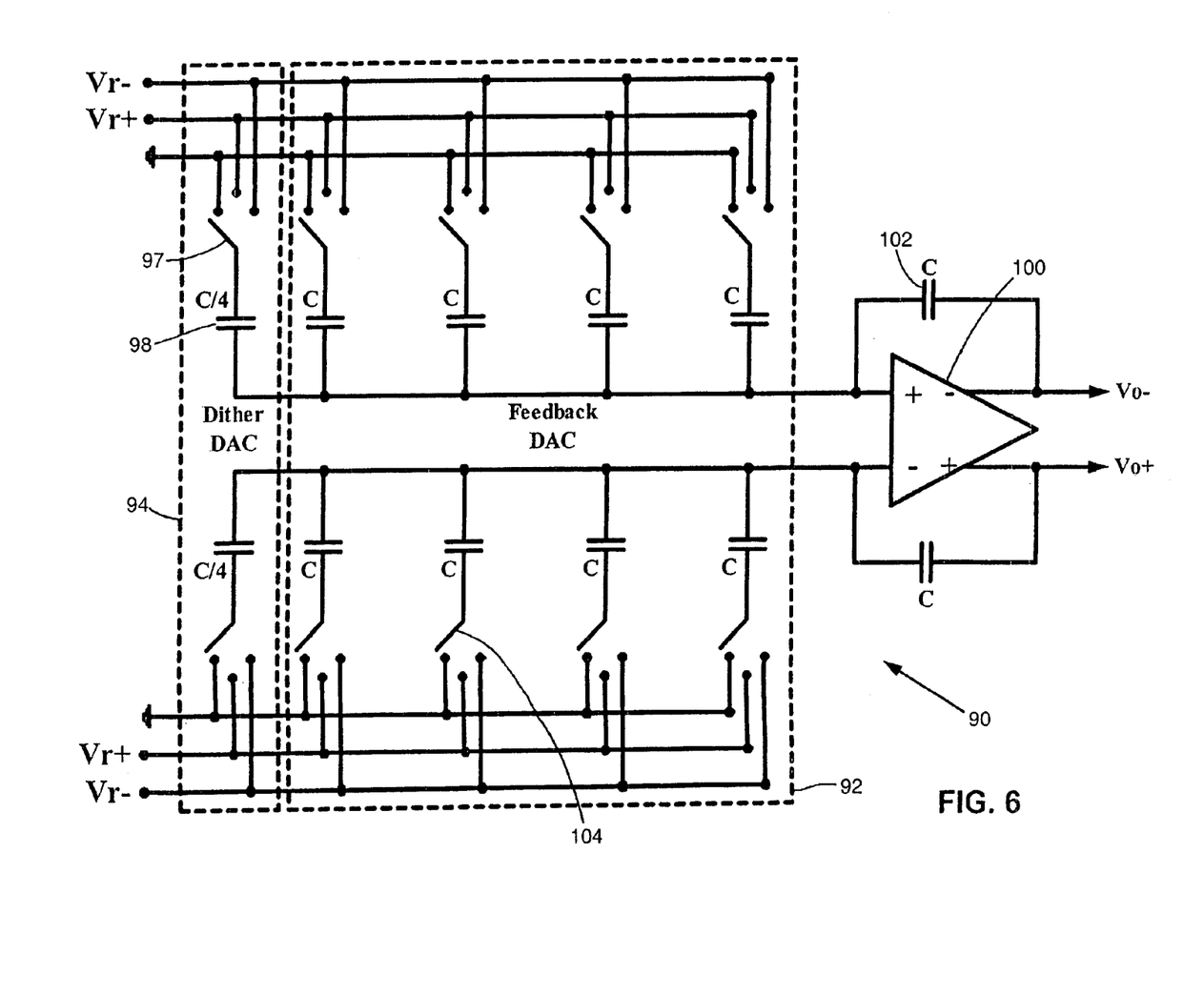
FIG. 6 is another exemplary circuit diagram of a multiplying and integrating DAC used in the first order modulator of FIG. 2.

FIGS. 5 and 6 are exemplary circuit diagrams of a multiplying and integrating DAC (MDAC) 90 used in the modulator 50. The MDAC 90 consists of two parts, a regular feedback DAC 92 and a dither DAC 94. The regular feedback DAC 92 includes unit capacitors 96, each having a size of C. The dither DAC 94 includes dither capacitors 98, each having a size of C/4. The MDAC 90 also includes a comparator 100 and integrating capacitors 102.

FIG. 5 shows the MDAC 90 being used in a sampling phase of the modulator 50. The dither DAC 94 sums in a digital dither signal dt(k) into the outputs of the ADC1 54.

In the sampling phase, the MDAC 90 includes sampling capacitors where the size of the sampling capacitors is 4C.

FIG. 6 shows the MDAC 90 being used in a feedback phase of the modulator 50. In the feedback phase, the MDAC 90 is shown to have feedback capacitors 104, each having a size of C. Thus the MDAC 90 achieves a gain of four by keeping the feedback capacitors 104 equal to ¼ the size of the sampling capacitor 100. In the feedback phase the feedback DAC 92 matches thermometer outputs of the ADC1 54.

Thus the effective sampling capacitor is 4C while the effective feedback capacitor is C. The unit capacitors of the MDAC 90 are C, with a maximum of 4C connected to a reference voltages when the ADC1 54 sees an input close to one of the rails. Nine reference levels are obtained from connecting the four differential unit capacitors to the positive reference voltage Vr+, the negative reference voltage Vr−, and/or to an analog ground. A maximum reference is attained by connecting 4C at the positive input to Vr+, while 4C at the negative input are connected to Vr−. A zero reference is obtained by connected all the DAC capacitors to analog ground.

The magnitude of the dither dt(k) is ¼ of the magnitude of the reference voltages. This is achieved by using the dither capacitor 98 equal to ¼ the size of the unit capacitor 96 in the MDAC 90. Thus, from FIGS. 5 and 6 it is obvious that a 5 bit DAC is not necessary in order to account for the digital dither with ¼ the magnitude of an LSB from the 3.1 bit ADC1 54. The feedback DAC 92 is a regular 3 bit DAC, while the dither DAC 94 constitutes an extra ¼ unit capacitor. This configuration relaxes the complexity of switches 97 for the feedback DAC 92 compared to a full 5 bit DAC. Since the dither DAC 94 features dither capacitors 98 equal to ¼ of the unit capacitors 96 of the feedback DAC 92, the minimum size of the sampling capacitors is limited somewhat. Due to the offseted ADC1 54 and the inherent linearity gain from the multi-bit feedback DAC 92, mismatch shaping of the MDAC 90 is not necessary.

Figure 7:
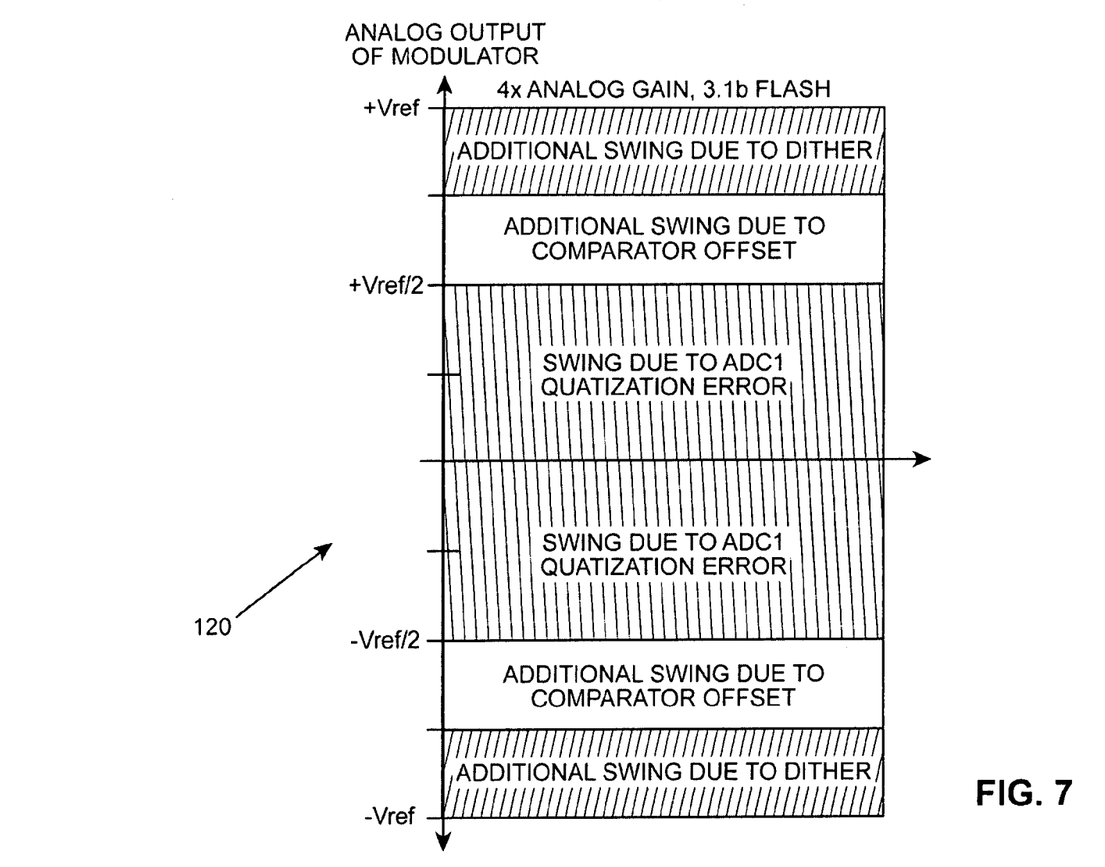
FIG. 7 is an exemplary signal diagram of an output signal of the first order modulator of FIG. 2.

FIG. 7 is an exemplary signal diagram 120 of an output signal d1(k) of the first order modulator 50 of FIG. 2. The diagram 120 shows that the total output swing of d1(k) is +/−1 Vref. Of this total output swing, a swing of +/−0.5 Vref is due to the quantization noise of the 3.1 bit ADC1 54. This will be the total output swing in absence of and when the comparators are ideal. The dither dt(k) introduces an additional +/−0.25 Vref swing when the dither DAC 94 uses a ¼ unit capacitor. In this configuration, the maximum tolerable comparator offset is +/−¼ LSB of the 3.1 bit ADC 1 54, resulting in additional +/−0.25 Vref swing. For example, when Vref equals 1V, the LSB of the ADC1 54 equals 250 mV, and the tolerable comparator offset is +/−62.5 mV. Thus, to fit dither dt(k) in a residue voltage budget, the comparators of the ADC1 54 must be designed for 4 bit accuracy. In this design, the dither dt(k) is controlled by a 1 bit pseudo-random signal that is interpreted as positive dither if equal to '1', and negative dither if equal to '0'. In order to ensure maximum swing of the input signal, the dither changes magnitude when the ADC1 54 sees an input signal that is close to one of the rails. With an input near positive rail, the dither is only allowed to switch between maximum negative dither and zero. Similarly, with an input near negative rail, the dither is only allowed to switch between maximum positive input and zero.

The pipelined ADC2 14 operates at a reduced sample rate, clocked with a frequency fs/N, where fs is the system clock frequency. Every Nth digital residue voltage d2 at the input of the ADC2 14 is combined with a filtered output of the ADC1 54 in order to create a digital representation dg of the analog input g(t). This is made possible by combining a decimation filter with reconstruction filters, resulting in combined decimation and reconstruction filters H1(z) 36 and H2(z) 38. The combined decimation and reconstruction filters H1(z) 36 and H2(z) 38 operate as a digital correction circuit that combines the outputs of the ADC2 14 and the ADC1 22 and the digital dither signal in a manner so as to cancel the effect of the digital dither signal from the combined outputs of the ADC2 14 and the ADC1 22.

Figure 8:
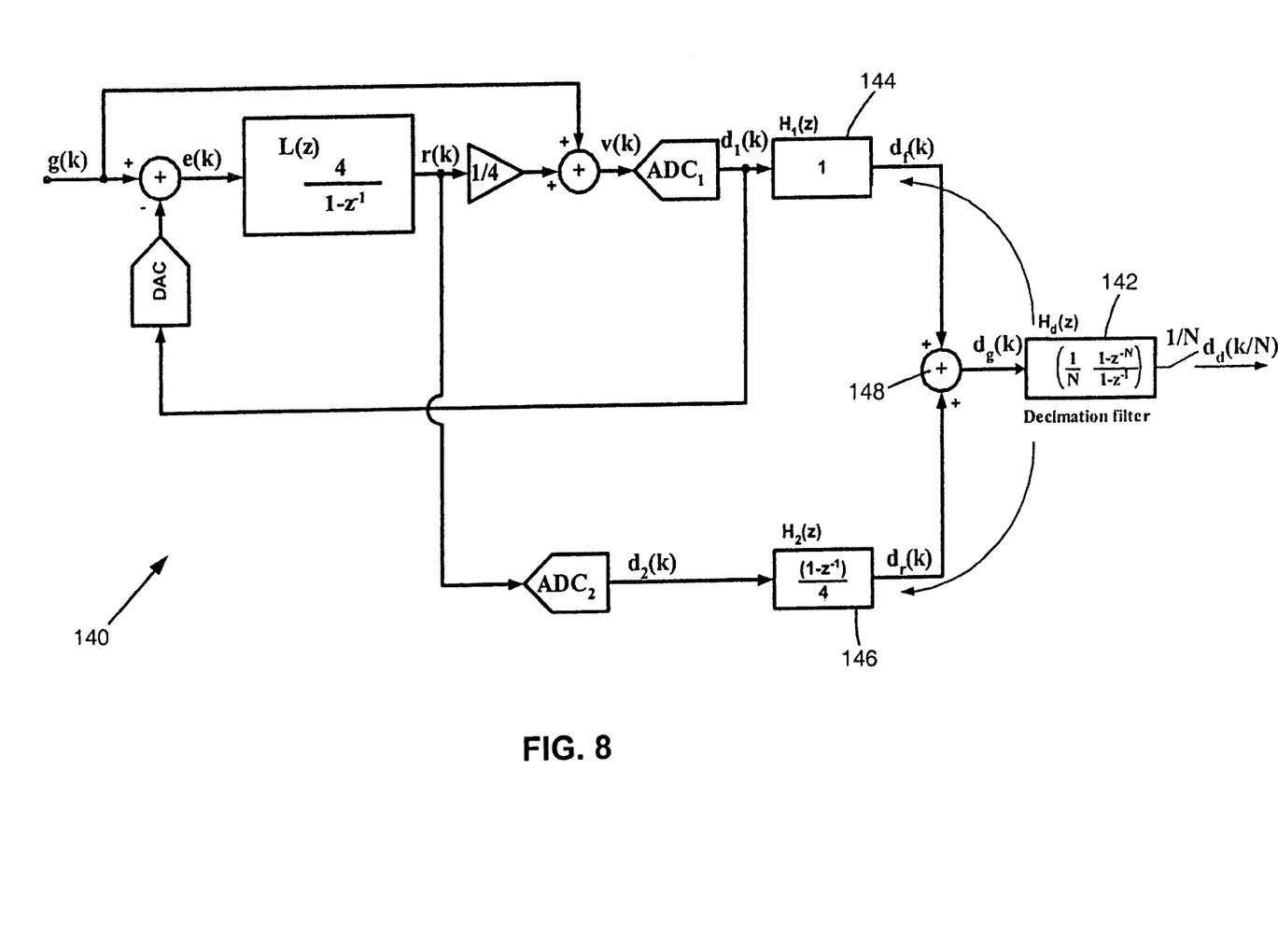
FIG. 8 is a block diagram of a 10 bit MASH ADC with a first order sinc decimation filter.

An example of a design procedure for reducing the sampling rate of ADC2 14 using a first order sinc filter is shown in FIGS. 8–12. FIG. 8 is a block diagram of a 10 bit MASH ADC circuit 140 with a first order sinc decimation filter 142. The ADC circuit 140 includes a first recombination filter 144 to filter a digital output d1(k) of a first stage ADC, a second recombination filer 146 to filter a digital output d2(k) of the second stage ADC, and a recombination adder 148.

Figure 9:
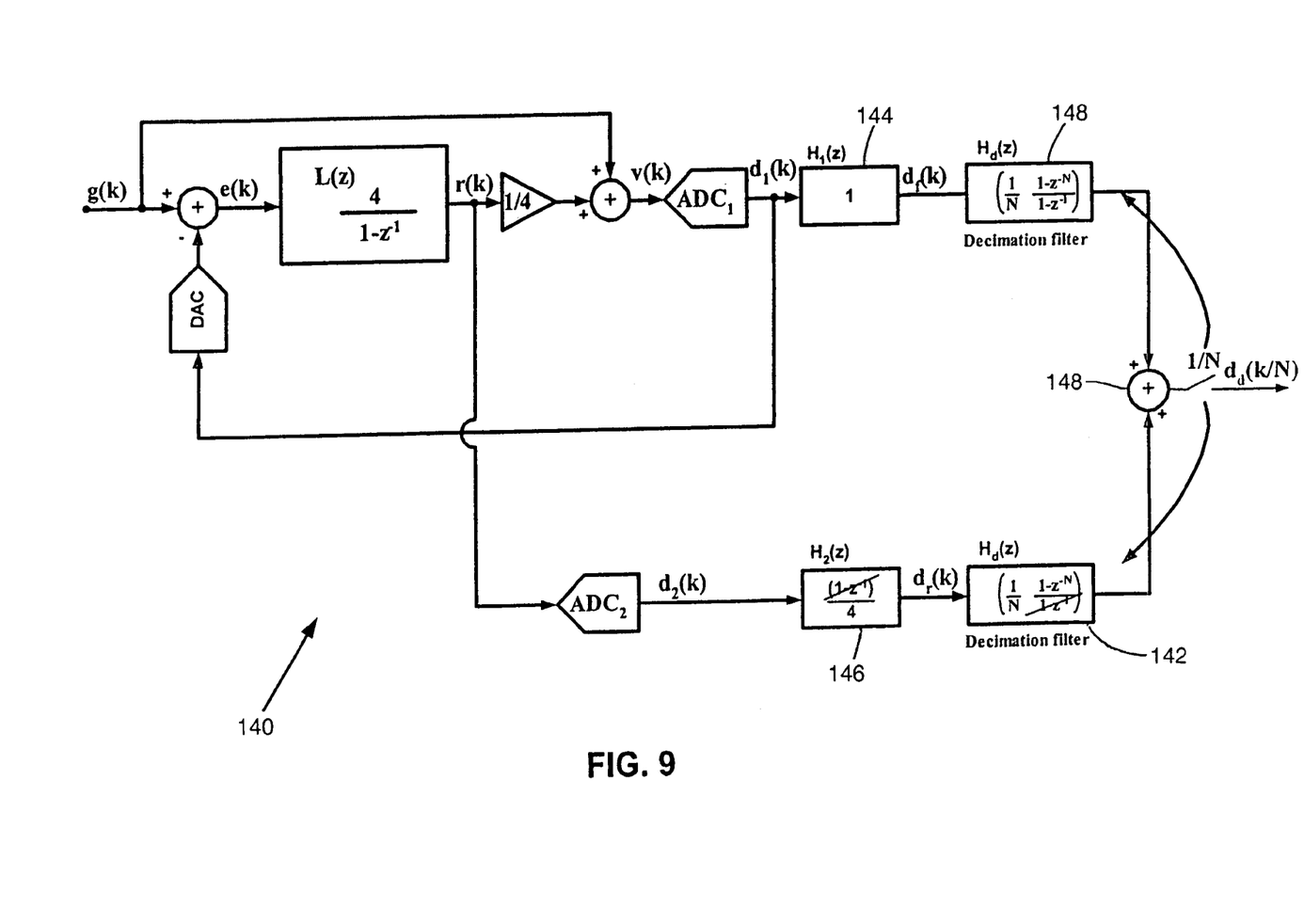
FIG. 9 is a block diagram of a 10 bit MASH ADC with a first order sinc decimation filter in front of a recombination adder.

FIG. 9 is a block diagram of the 10 bit MASH ADC 140 of FIG. 8, with a first order sinc decimation filter 142 in front of the recombination adder 148. As shown in FIG. 9, the numerator of the second recombination filter 146 and the denominator of the decimation filter 142 can be canceled with each other.

Figure 10:
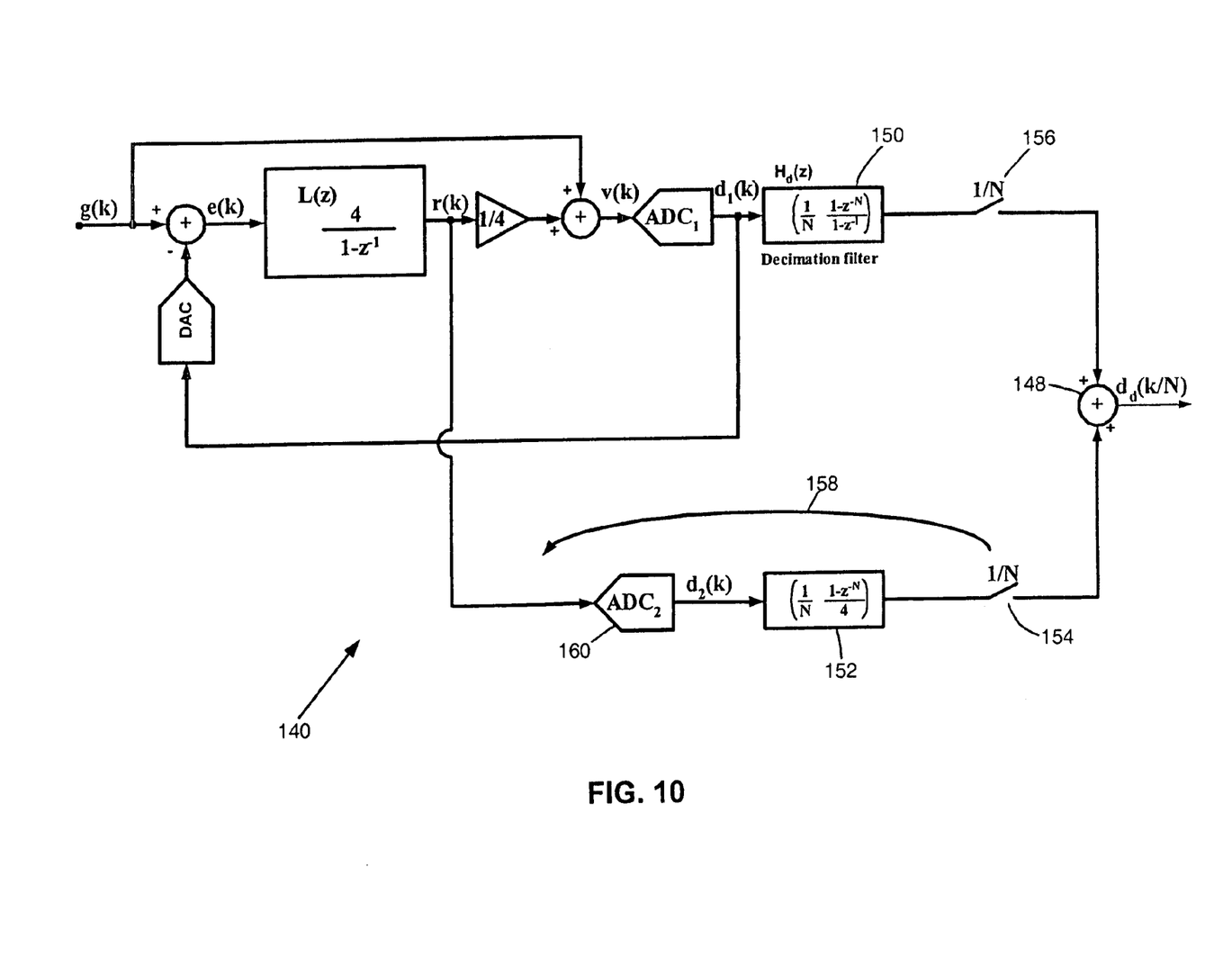
FIG. 10 is a block diagram of a 10 bit MASH ADC with a combined first order sinc decimation filter and recombinations filter.

FIG. 10 is a block diagram of the 10 bit MASH ADC 140 of FIG. 8, with a first combined decimation filter 150 and a second combined decimation filter 152. The first combined decimation filter 150 is a combination of the first recombination filter 144 and the decimation filter 142. The second combined decimation filter 152 is a combination of the second recombination filter 146 and the decimation filter 142. As shown in FIG. 10, switching nodes 154 and 156 are moved in front of recombination adder 148. Further shown in FIG. 10, by the numeral 158 is that the switching node 154 can be moved in front of an ADC2 160.

Figure 11:
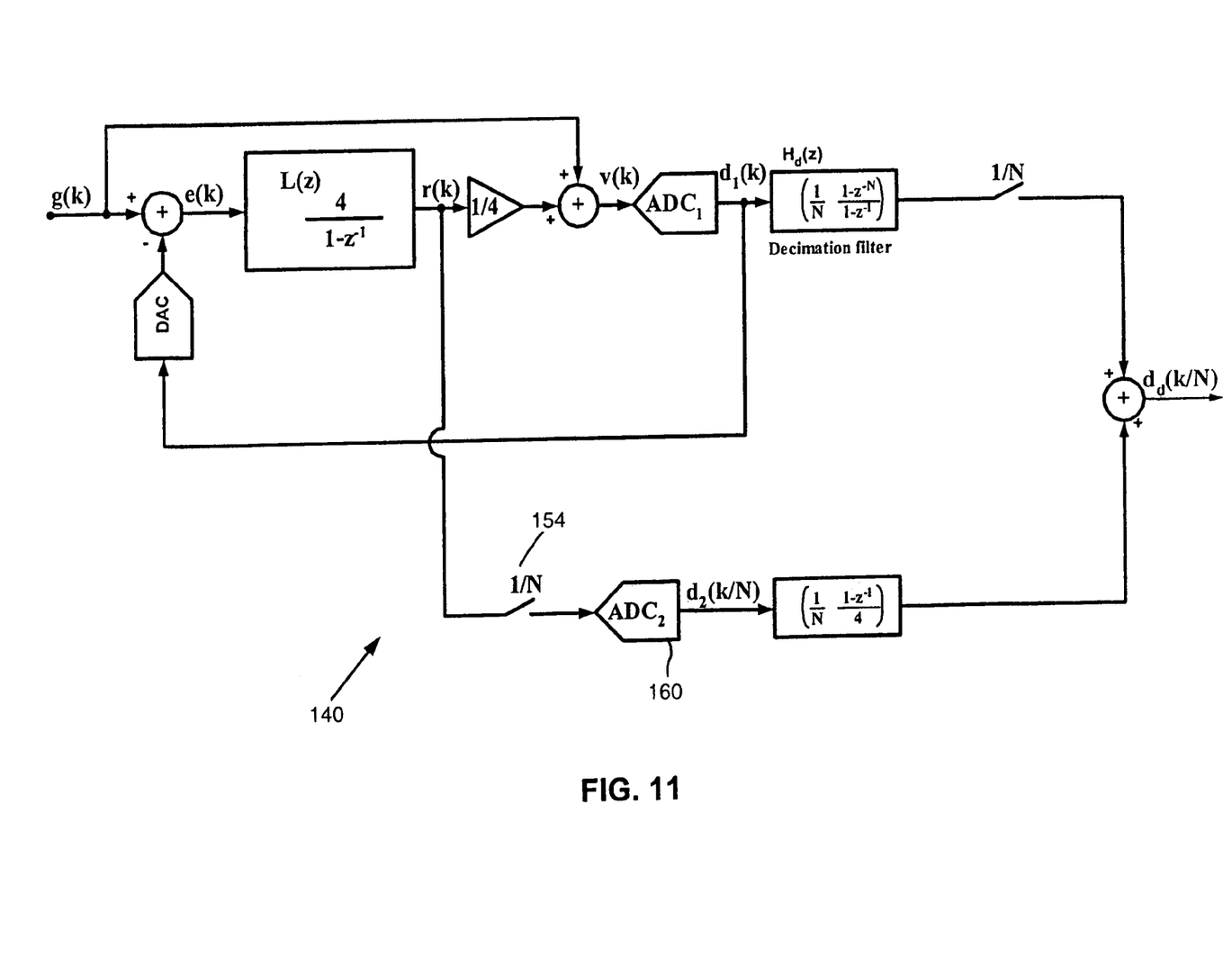
FIG. 11 is a block diagram of a 10 bit MASH ADC with a reduced sampling rate in a second stage.

FIG. 11 is a block diagram of the 10 bit MASH ADC 140 of FIG. 8, with the switching node 154 moved in front of the ADC2 160, to provide a reduced sampling rate in a second stage of the 10 bit MASH ADC 140.

A sinc decimation filter is not appropriate for a VDSL application, because ripple or band bending in the signal band is too high near the edge of a band using a first order sinc filter. An alternate decimation filter must be used instead of the sinc decimation filter, with the requirement that the denominator of such alternate decimation filter is exactly D=1−z−1, while the nominator is a function of f(z−N). The decimation filter should be designed to match the requirements of an application, yielding proper band-pass ripple and stop-band attenuation, and fulfilling requirements for the numerator and the denominator given above. An alternate implementation using such a decimation filter that has such a transfer function is illustrated in FIGS. 12 and 13.

Figure 12:
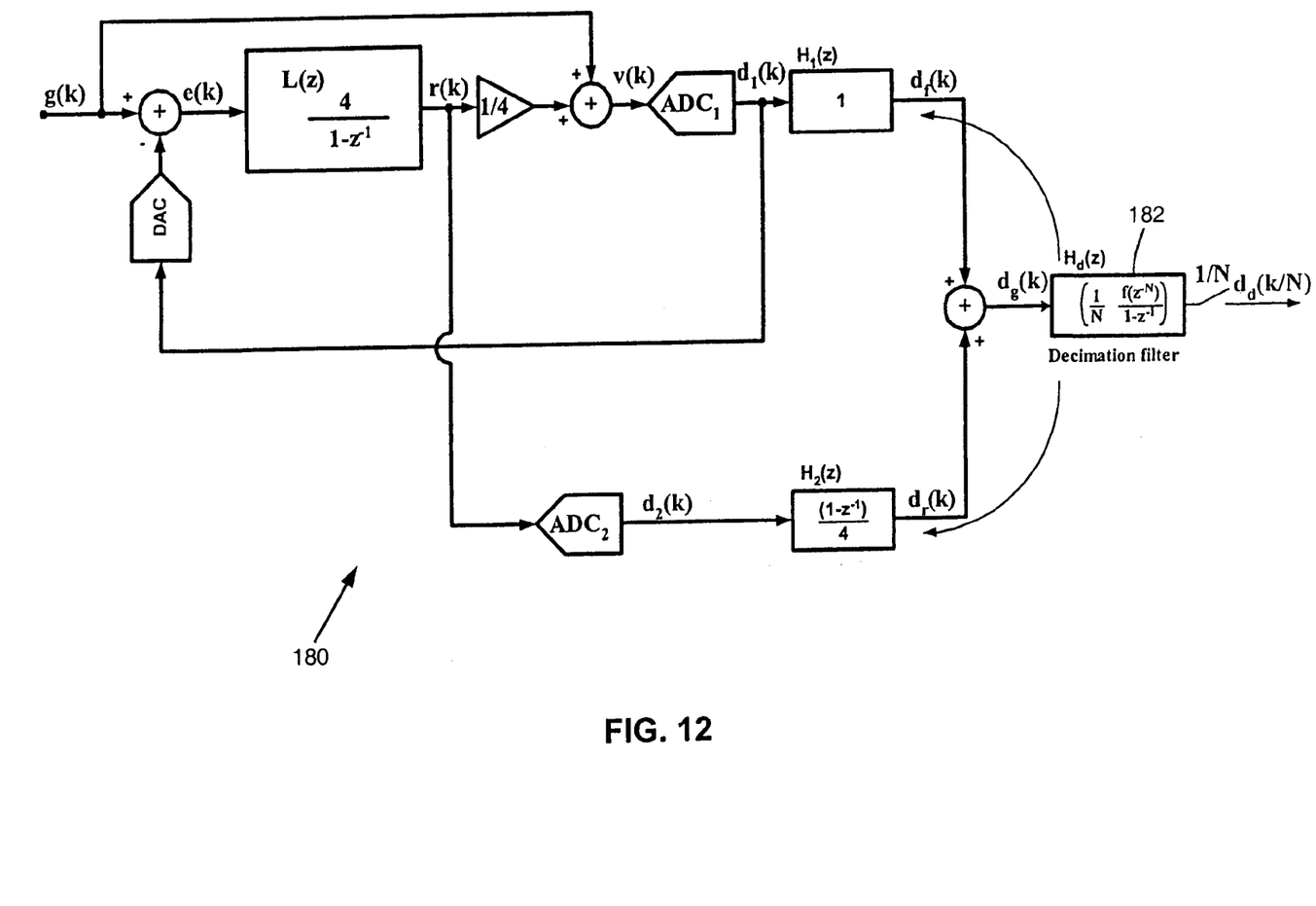
FIG. 12 is a block diagram of a 10 bit MASH ADC with a general decimation filter.

Specifically FIG. 12 is a block diagram of a 10 bit MASH ADC 180 with a general decimation filter 182.

Figure 13:
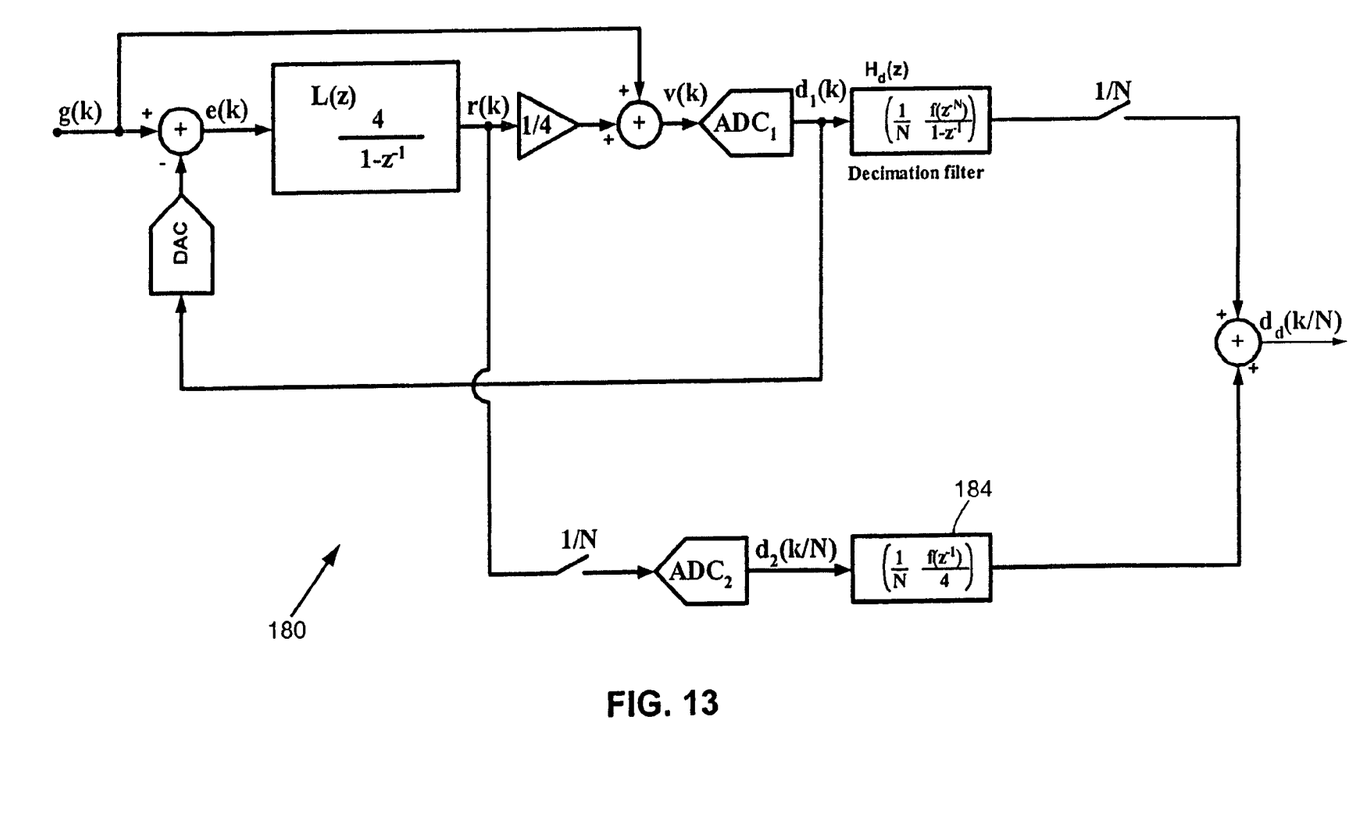
FIG. 13 is a block diagram of a 10 bit MASH ADC with a general decimation filter combined with a recombination filter.

FIG. 13 is a block diagram of the 10 bit MASH ADC 180 of FIG. 12 with the general decimation filter 182 combined with a recombination filter, as shown by the recombined decimation filter 184.

In summary, this component is capable of 87 dB SNR when operating at an OSR of four. The input swing available with +/−1V references is +/−1V. With a 3.1b FLASH ADC, no separate S/H is necessary, since the sampling network of this FLASH can be matched to the sampling network of the first stage integrator for input frequencies up to 40 MHz. The modulator disclosed in here is capable of 90–100 dB spurious free dynamic range (SFDR) without mismatch shaping or dynamic element matching of a feedback DAC due to digital redundancy that may automatically compensate for offsets in a first stage quantizer. The achievable power dissipation is superior compared to pipelined ADCs, since the second stage operates at a reduced sampling rate.

The example in the disclosed architecture is just one of many possible configurations for this system. The first stage quantizer can have resolutions down to 2.1b while still allowing for analog gain of the modulator and full scale input swing. The modulator disclosed in here may be designed to have higher order than the first order modulator in this example. In that case the summing input to a FLASH ADC will, in general, have as many inputs as there are integrators in a noise shaping filter. For low input frequencies the dedicated S/H module is not strictly necessary, as the modulator can sample low to medium frequency with a low resolution FLASH as the quantizer.

The ADC circuit disclosed in here is capable of providing up to 13 bit resolution with a signal bandwidth of 12.5 MHz. Due to an OSR of only four, low power dissipation is achieved. Thus high resolution is achieved with low power dissipation. Such an ADC circuit is well suited for communications applications, since the sampling frequency used by the ADC circuit is higher than twice the Nyquist frequency, thereby enabling over-sampling and subsequent digital decimation. The ADC circuit described in here features an OSR of four. At 12.5 MHz signal bandwidth the sampling frequency is 100 MHz. This ADC circuit thereby relaxes the requirements of an anti-aliasing filter preceding the ADC circuit in a VDSL application. OSR of four allows for digital decimation, meaning that the anti-aliasing filter can have a transition bandwidth between the signal-band and the stop-band, ranging from 12 MHz to 50 MHz. The ADC circuit can be made simpler and therefore more power efficient than one using a filter for a Nyquist converter operating at 25 MHz, and requiring a steep transition bandwidth of only 500 kHz, from 12 MHz to 12.5 MHz.

Although the forgoing text sets forth a detailed description of numerous different embodiments of the invention, it should be understood that the scope of the invention is defined by the words of the claims set forth at the end of this patent. The detailed description is to be construed as exemplary only and does not describe every possible embodiment of the invention because describing every possible embodiment would be impractical, if not impossible. Numerous alternative embodiments could be implemented, using either current technology or technology developed after the filing date of this patent, which would still fall within the scope of the claims defining the invention.

Thus, many modifications and variations may be made in the techniques and structures described and illustrated herein without departing from the spirit and scope of the present invention. Accordingly, it should be understood that the methods and apparatus described herein are illustrative only and are not limiting upon the scope of the invention.

What is claimed is:

1. An analog-to-digital converter system for converting an analog input signal to a digital output signal, the system comprising:
   a first stage analog-to-digital converter circuit adapted to convert the analog input signal into a first stage digital output;
   a digital signal generator adapted to generate a digital test signal, wherein the digital signal generator is further adapted to change an amplitude of the digital test signal based on at least one of a polarity and an amplitude of the analog input signal;
   a combiner coupled to the first stage analog-to-digital converter circuit and adapted to combine the digital test signal with the digital output of the first stage analog-to-digital converter circuit;
   a residue signal generator adapted to receive the output of the combiner and to generate a residue signal using the output of the combiner and the analog input signal;
   a noise shaping circuit adapted to noise shape the residue signal;
   a sampling circuit coupled to the output of the noise shaping circuit and adapted to sample the noise shaped residue signal;
   a second stage analog-to-digital converter circuit coupled to the output of the sampling circuit and adapted to generate a second stage digital output based on the sampled residue signal; and
   a digital correction circuit coupled to the output of the first stage analog-to-digital converter circuit and to the output of the second stage analog-to-digital converter circuit and adapted to combine the first stage digital output and the second stage digital output using a reconstruction filter.

2. An analog-to-digital converter system of claim 1, wherein the first stage analog-to-digital converter circuit operates at a first operating frequency and the second stage analog-to-digital converter circuit operates at a second operating frequency, wherein the second operating frequency is a fraction of the first operating frequency.

3. An analog-to-digital converter system of claim 2, wherein the second operating frequency is equal to a Nyquist frequency of the sampling circuit and the first operating frequency is at least twice the Nyquist frequency of the sampling circuit.

4. An analog-to-digital converter system of claim 1, wherein the digital signal generator is further adapted to change an amplitude of the digital test signal in a manner so as to prevent the second stage analog-to-digital converter circuit from saturating.

5. An analog-to-digital converter system of claim 1, wherein the digital correction circuit further includes a decimation filter adapted to cancel the effect of the digital test signal from the combination of the first stage digital output and the second stage digital output.

6. An analog-to-digital converter system of claim 1, wherein the second stage analog-to-digital converter circuit is one of a pipelined analog-to-digital converter circuit or a cyclic analog-to-digital converter circuit and wherein the first stage analog-to-digital converter circuit is a delta sigma analog-to-digital converter circuit.

7. An analog-to-digital converter system of claim 1, wherein the first stage analog-to-digital converter circuit further includes:
   a multiplier coupled to the output of the noise shaping circuit and adapted to multiply the output of the noise shaping circuit;
   a feed-forward path adapted to feed-forward the analog input signal to a summer circuit;
   the summer circuit adapted to combine the analog input signal and the output of the multiplier; and
   a quantizer adapted to generate a quantized output signal based on the combined output of the summer circuit.

8. An analog-to-digital converter system of claim 7, wherein the quantizer is further adapted to introduce an offset into the quantized output signal.

9. An analog-to-digital converter system of claim 8, further comprising an offset correction circuit adapted to correct the offset introduced by the quantizer.

10. An analog-to-digital converter system of claim 1, wherein the second stage analog-to-digital converter circuit includes a calibration filter adapted to correct gain errors and pole errors in the first stage digital output.

11. A method of converting an analog input signal to a digital output signal, the method comprising:
generating a first stage digital output based on the analog input signal;
generating a digital test signal, wherein the amplitude of the digital test signal changes based on at least one of a polarity and an amplitude of the analog input signal;
combining the first stage digital output with the digital test signal;
generating a residue signal from the combination of the first stage digital output and the digital test signal;
noise-shaping the residue signal;
sampling the noise shaped residue signal at a second operating frequency;
generating a second stage digital output signal based on the sampled residue; and
combining the first stage digital output and the second stage digital output in a manner so as to cancel the effect of the digital test signal.

12. A method of claim 11, wherein generating the first stage digital output includes generating the first stage digital output using a first stage analog-to-digital converter circuit operating at a first frequency, and wherein the second operating frequency is a fraction of the first operating frequency.

13. A method of claim 11, wherein the second operating frequency is equal to a Nyquist frequency of a sampling circuit used for sampling the noise shaped residue signal and the first operating frequency is at least twice the Nyquist frequency of a sampling circuit.

14. A method of claim 11, wherein noise-shaping the residue of the first stage analog-to-digital converter circuit further includes providing a gain to the residue of the first stage analog-to-digital converter circuit.

15. A method of claim 11, further comprising changing the amplitude of the digital test signal in a manner so as to prevent the second stage analog-to-digital converter circuit from saturating.

16. A method of claim 11, further comprising:
multiplying the noise shaped residue signal;
combining the analog input signal to the multiplied noise shaped residue signal; and
generating a quantized output signal based on the combination of the analog input signal and the multiplied noise shaped residue signal.

17. A method of claim 16, further comprising:
introducing an offset into the quantized output signal; and
correcting the offset introduced by the quantizer from the combination of the first stage digital output and the second stage digital output.

18. A method of claim 11, wherein combining the first stage digital output and the second stage digital output includes combining the first stage digital output and the second stage digital output using one of (1) software; (2) hardware or (3) firmware.

* * * * *